United States Patent
Yoo et al.

(10) Patent No.: US 11,297,217 B2
(45) Date of Patent: Apr. 5, 2022

(54) ELECTRONIC DEVICE PROVIDING STABILIZER FUNCTION

(71) Applicant: Samsung Electronics Co., Ltd., Gyeonggi-do (KR)

(72) Inventors: Chae Up Yoo, Seoul (KR); Su Min Yun, Incheon (KR); Woo Suk Kang, Seoul (KR); Se Woong Kim, Gyeongsangnam-do (KR)

(73) Assignee: Samsung Electronics Co., Ltd.

( * ) Notice: Subject to any disclaimer, the term of this patent is extended or adjusted under 35 U.S.C. 154(b) by 185 days.

(21) Appl. No.: 16/628,108

(22) PCT Filed: Aug. 9, 2018

(86) PCT No.: PCT/KR2018/009132
§ 371 (c)(1),
(2) Date: Jan. 2, 2020

(87) PCT Pub. No.: WO2019/031894
PCT Pub. Date: Feb. 14, 2019

(65) Prior Publication Data
US 2020/0128170 A1  Apr. 23, 2020

(30) Foreign Application Priority Data

Aug. 9, 2017 (KR) .......................... 10-2017-0101180

(51) Int. Cl.
*H04B 1/38* (2015.01)
*H04N 5/232* (2006.01)
(Continued)

(52) U.S. Cl.
CPC ....... *H04N 5/23203* (2013.01); *H01Q 1/2291* (2013.01); *H04N 5/23248* (2013.01); *H04W 4/80* (2018.02); *H05K 5/023* (2013.01)

(58) Field of Classification Search
CPC ........ H04W 4/80; H01Q 1/2291; H05K 5/023
(Continued)

(56) References Cited

U.S. PATENT DOCUMENTS 9,170,473 B1 * 10/2015 Li ........................... F16M 11/10
9,835,935 B1 * 12/2017 Wilgosz ................. F16M 11/28
(Continued)

FOREIGN PATENT DOCUMENTS

KR   1020160089188   7/2016
KR   1020170057574   5/2017

OTHER PUBLICATIONS

PCT/ISA/210 Search Report issued on PCT/KR2018/009132, pp. 5.
PCT/ISA/237 Written Opinion issued on PCT/KR2018/009132, pp. 6.

*Primary Examiner* — April G Gonzales
(74) *Attorney, Agent, or Firm* — The Farrell Law Firm, P.C.

(57) ABSTRACT

In various embodiments, an electronic device includes a main body unit including a grip area for gripping by a user, a first joint portion formed at or connected to one end of the main body unit, a first sub-body unit connected to the main body unit by the first joint portion, and a communication circuit. The main body unit includes a main PCB including a processor, the first joint portion includes a first motor PCB including a control circuit and a first antenna radiator and being electrically connected to the main PCB, the processor allows the control circuit of the first motor PCB to control the first sub-body unit connected by the first joint portion, and the communication circuit transmits and receives signals to and from an external device via the first antenna radiator of the first motor PCB. Above this, various embodiments figured out through the specification are possible.

14 Claims, 11 Drawing Sheets

(51) Int. Cl.
*H04W 4/80* (2018.01)
*H01Q 1/22* (2006.01)
*H05K 5/02* (2006.01)

(58) Field of Classification Search
USPC .................................................. 348/207.99
See application file for complete search history.

(56) References Cited

U.S. PATENT DOCUMENTS

| | | | |
|---|---|---|---|
| 9,995,993 B2* | 6/2018 | Li | F16M 11/28 |
| 10,274,129 B2* | 4/2019 | Saika | F16M 11/18 |
| 2014/0043436 A1* | 2/2014 | Bell | H04N 13/204 |
| | | | 348/46 |
| 2014/0105591 A1* | 4/2014 | Van Norman | G03B 17/38 |
| | | | 396/544 |
| 2014/0269553 A1* | 9/2014 | Stein | H04W 12/06 |
| | | | 370/329 |
| 2015/0063795 A1* | 3/2015 | Orton | F16M 11/041 |
| | | | 396/425 |
| 2015/0071627 A1* | 3/2015 | Hoang | F16M 11/10 |
| | | | 396/421 |
| 2015/0237251 A1* | 8/2015 | Yang | H04N 5/23206 |
| | | | 348/211.2 |
| 2016/0252799 A1* | 9/2016 | Li | F16M 13/04 |
| | | | 396/425 |
| 2016/0352992 A1* | 12/2016 | Saika | F16M 11/041 |
| 2017/0227162 A1* | 8/2017 | Saika | F16M 11/041 |
| 2018/0190031 A1* | 7/2018 | Choi | G02B 27/0093 |
| 2019/0195422 A1* | 6/2019 | Nhan | F16H 25/20 |

\* cited by examiner

ELECTRONIC DEVICE PROVIDING STABILIZER FUNCTION

PRIORITY

This application is a National Phase Entry of PCT International Application No. PCT/KR2018/009132 which was filed on Aug. 9, 2018, and claims priority to Korean Patent Application No. 10-2017-0101180, which was filed on Aug. 9, 2017, the content of each of which is incorporated herein by reference.

TECHNICAL FIELD

The present disclosure relates to an antenna technology mounted on an electronic device that provides a function of stabilizer.

BACKGROUND ART

An electronic device providing a function of stabilizer measures a rotation direction or an inclined angle of an external electronic device (e.g., a camera or a smartphone) with a camera function using various sensors, such as an acceleration sensor or a gyro sensor. The stabilizer provides the function allowing a lens of the external electronic device to face a subject while maintaining a level horizon regardless of movement and inclination of the external electronic device.

The electronic device (e.g., a camera gimbal) providing the function of stabilizer controls support members for the external electronic device using a motor such that the external electronic device connected to the electronic device maintains the level horizon. As another way, the electronic device includes an antenna mounted thereon to communicate with the external electronic device coupled to the electronic device or another external device (e.g., a server). The electronic device controls the external electronic device or receives data from another external device through the antenna.

The above information is presented as background information only to assist with an understanding of the present disclosure. No determination has been made, and no assertion is made, as to whether any of the above might be applicable as prior art with regard to the present disclosure.

DISCLOSURE

Technical Problem

The electronic device providing the function of stabilizer includes a handle to allow a user to hold the electronic device. Accordingly, the handle includes a grip area.

The electronic device includes the antenna to communicate with the external device. A main printed circuit board (main PCB) of the electronic device is disposed inside the handle. When the antenna is mounted on the main PCB, a performance of the antenna is degraded as the user grips the handle.

A housing of the electronic device or at least a portion of the support member is formed of a metal material for its strength. In addition, at least a portion of the main PCB or a motor PCB, which is disposed inside the electronic device, includes a metal part. In this case, the performance of the antenna is degraded due to the metal part disposed between the antenna and the external device including the camera.

Aspects of the present disclosure are to address at least the above-mentioned problems and/or disadvantages and to provide at least the advantages described below. Accordingly, an aspect of the present disclosure is to provide an electronic device capable of improving the performance of the antenna in the electronic device providing the function of stabilizer.

Technical Solution

In accordance with an aspect of the present disclosure, an electronic device includes a main body unit including a grip area for gripping by a user, a first joint portion formed at or connected to one end of the main body unit, a first sub-body unit connected to the main body unit by the first joint portion, and a communication circuit. The main body unit includes a main PCB including a processor, the first joint portion includes a first motor PCB including a control circuit and a first antenna radiator and being electrically connected to the main PCB, the processor allows the control circuit of the first motor PCB to control the first sub-body unit connected by the first joint portion, and the communication circuit transmits and receives signals to and from an external device via the first antenna radiator of the first motor PCB. Above this, various embodiments figured out through the specification are possible.

Advantageous Effects

According to embodiments disclosed in the present disclosure, the performance of the antenna of the electronic device may be prevented from being degraded due to a user's grip or a metal part included in the electronic device.

In addition, various effects directly or indirectly ascertained through the present disclosure may be provided.

Other aspects, advantages, and salient features of the disclosure will become apparent to those skilled in the art from the following detailed description, which, taken in conjunction with the annexed drawings, discloses various embodiments of the present disclosure.

DESCRIPTION OF DRAWINGS

The above and other aspects, features, and advantages of certain embodiments of the present disclosure will be more apparent from the following description taken in conjunction with the accompanying drawings, in which.

With reference to the drawings, the same or similar components may be designated by the same or similar reference numerals.

MODE FOR INVENTION

Figure 1A:
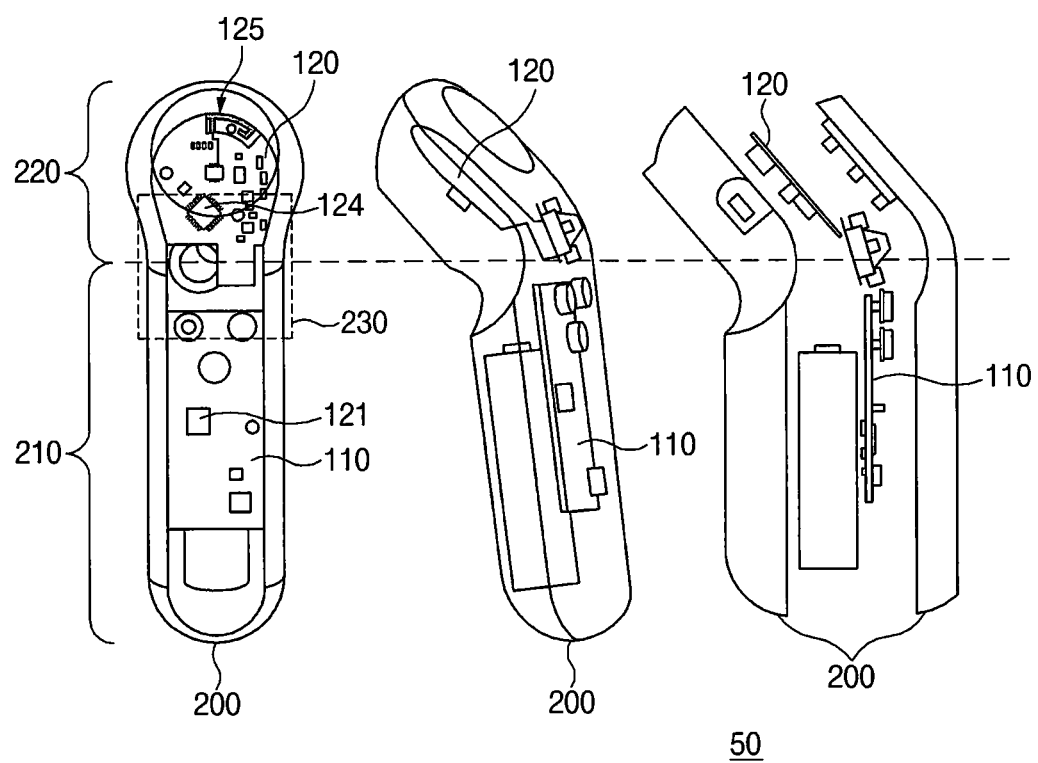
FIG. 1a is a perspective view showing an electronic device according to an embodiment of the present invention.

Hereinafter, various embodiments of the present disclosure may be described with reference to accompanying drawings. Accordingly, those of ordinary skill in the art will recognize that modification, equivalent, and/or alternative on the various embodiments described herein can be variously made without departing from the scope and spirit of the present disclosure. With regard to description of drawings, similar components may be marked by similar reference numerals.

In the present disclosure, the expressions "have", "may have", "include" and "comprise", or "may include" and "may comprise" used herein indicate existence of corresponding features (e.g., components such as numeric values, functions, operations, or parts) but do not exclude presence of additional features.

In the present disclosure, the expressions "A or B", "at least one of A or/and B", or "one or more of A or/and B", and the like may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used in the present disclosure may be used to refer to various components regardless of the order and/or the priority and to distinguish the relevant components from other components, but do not limit the components. For example, "a first user device" and "a second user device" indicate different user devices regardless of the order or priority. For example, without departing the scope of the present disclosure, a first component may be referred to as a second component, and similarly, a second component may be referred to as a first component.

It will be understood that when a component (e.g., a first component) is referred to as being "(operatively or communicatively) coupled with/to" or "connected to" another component (e.g., a second component), it may be directly coupled with/to or connected to the other component or an intervening component (e.g., a third component) may be present. In contrast, when a component (e.g., a first component) is referred to as being "directly coupled with/to" or "directly connected to" another component (e.g., a second component), it should be understood that there are no intervening components (e.g., a third component).

According to the situation, the expression "configured to" used in the present disclosure may be used as, for example, the expression "suitable for", "having the capacity to", "designed to", "adapted to", "made to", or "capable of". The term "configured to" must not mean only "specifically designed to" in hardware. Instead, the expression "a device configured to" may mean that the device is "capable of" operating together with another device or other parts. For example, a "processor configured to (or set to) perform A, B, and C" may mean a dedicated processor (e.g., an embedded processor) for performing a corresponding operation or a generic-purpose processor (e.g., a central processing unit (CPU) or an application processor) which performs corresponding operations by executing one or more software programs which are stored in a memory device.

Terms used in the present disclosure are used to describe specified embodiments and are not intended to limit the scope of the present disclosure. The terms of a singular form may include plural forms unless otherwise specified. All the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal unless expressly so defined in various embodiments of the present disclosure. In some cases, even if terms are terms which are defined in the present disclosure, they may not be interpreted to exclude embodiments of the present disclosure.

An electronic device according to various embodiments of the present disclosure may include at least one of, for example, smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, or wearable devices. According to various embodiments, the wearable device may include at least one of an accessory type (e.g., watches, rings, bracelets, anklets, necklaces, glasses, contact lens, or head-mounted-devices (HMDs)), a fabric or garment-integrated type (e.g., an electronic apparel), a body-attached type (e.g., a skin pad or tattoos), or a bio-implantable type (e.g., an implantable circuit).

According to various embodiments, the electronic device may be a home appliance. The home appliances may include at least one of, for example, televisions (TVs), digital versatile disc (DVD) players, audios, refrigerators, air conditioners, cleaners, ovens, microwave ovens, washing machines, air cleaners, set-top boxes, home automation control panels, security control panels, TV boxes (e.g., Samsung HomeSync™, Apple TV™, or Google TV™), game consoles (e.g., Xbox™ or PlayStation™), electronic dictionaries, electronic keys, camcorders, electronic picture frames, and the like.

According to another embodiment, an electronic device may include at least one of various medical devices (e.g., various portable medical measurement devices (e.g., a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation devices, Global Navigation Satellite System (GNSS), event data recorders (EDRs), flight data recorders (FDRs), vehicle infotainment devices, electronic equipment for vessels (e.g., navigation systems and gyrocompasses), avionics, security devices, head units for vehicles, industrial or home robots, automated teller machines (ATMs), points of sales (POSs) of stores, or internet of things (e.g., light bulbs, various sensors, electric or gas meters, sprinkler devices, fire alarms, thermostats, street lamps, toasters, exercise equipment, hot water tanks, heaters, boilers, and the like).

According to an embodiment, the electronic device may include at least one of parts of furniture or buildings/structures, electronic boards, electronic signature receiving devices, projectors, or various measuring instruments (e.g., water meters, electricity meters, gas meters, or wave meters, and the like). According to various embodiments, the electronic device may be one of the above-described devices or a combination thereof. An electronic device according to an embodiment may be a flexible electronic device. Furthermore, an electronic device according to an embodiment of the present disclosure may not be limited to the above-described electronic devices and may include other electronic devices and new electronic devices according to the development of technologies.

Hereinafter, electronic devices according to various embodiments will be described with reference to the accompanying drawings. In the present disclosure, the term "user" may refer to a person who uses an electronic device or may refer to a device (e.g., an artificial intelligence electronic device) that uses the electronic device.

FIG. 1a is a perspective view showing an electronic device 50 according to an embodiment of the present invention.

Referring to FIG. 1a, the electronic device 50 may include a housing 200 including a grip portion 210 for gripping by a user and a connection portion 220 to which a support member is connected, which is capable of being connected to the electronic device 50.

As shown in FIG. 1a, the housing 200 may include the grip portion 210 having a straight line shape and the connection portion 220 having an oblique line shape with respect to the grip portion 210.

In an embodiment, the electronic device 50 may include a main PCB 110 disposed in the grip portion 210. For example, the main PCB 110 may include a processor 121.

In an embodiment, the electronic device 50 may include a motor PCB 110 that is disposed in the connection portion 220, includes a control circuit 124 and an antenna radiator 125, and electrically connected to the main PCB 110.

In an embodiment, the processor 121 of the main PCB 110 may be configured to allow the control circuit 124 of the motor PCB 120 to control a movement of the support member (not shown) connected to the housing 200 through the connection portion 220. For instance, the control circuit 124 of the motor PCB 120 may control the movement of the support member such that a camera of an external device coupled to the support member maintains a level horizon and faces a subject.

The support member may include, for example, a joint portion connected to the housing, a body portion connected to the housing by the joint portion, a joint portion connecting the body portion and another body portion, and a fixing portion fixing the external device.

The support member may be configured differently depending on type and design of the external device to support. An example of the support member will be described later with reference to FIGS. 2a to 2d.

In an embodiment, the electronic device 50 may include a communication circuit electrically connected to the antenna radiator 125. For instance, the communication circuit may include a communication processor and an RF circuit. The communication circuit may be electrically connected to the antenna radiator 125 via a matching circuit. According to various embodiments, the communication circuit may be placed between the main PCB 110 and the motor PCB 120.

In an embodiment, the communication circuit may be configured to transmit and receive a signal to and from the external device coupled to the support member through the antenna radiator 125 of the motor PCB 120. The communication circuit may feed the antenna radiator 125 with power through the RF circuit.

In an embodiment, since the antenna radiator 125 is disposed in the connection portion 220 rather than the grip portion 210, a performance of the antenna may be prevented from being degraded due to a user's grip. The antenna radiator 125 may be included in the motor PCB 120 rather than the main PCB 110, and thus the antenna radiator 125 may be disposed in the connection portion 220.

In an embodiment, the communication circuit may be configured to communicate with the external device via the antenna radiator 125 of the motor PCB 120. In a case that the communication circuit communicates with the external device via the antenna radiator 125 of the motor PCB 120, the performance of the antenna may be degraded due to a metal part included in the motor PCB 120 or the user's grip.

According to an embodiment, the electronic device 50 may improve the performance of the antenna by communicating via the antenna radiator 125 of the motor PCB 120. For example, the communication circuit may be configured to perform a short-range communication (e.g., a Bluetooth communication) using the antenna radiator 125.

In an embodiment, the communication circuit may be configured to perform the Bluetooth communication with the external device coupled to the support member via the antenna radiator 125. For example, the communication circuit may be configured to transmit a control signal for controlling an external device that supports the camera function via the antenna radiator 125.

In an embodiment, the housing 200 may further include a button portion 230 to control an external device coupled to the electronic device 50 by the support member. For example, the external device may include an electronic device with the camera function, such as a camera or a mobile phone. The button portion 230 may include, for example, a power on/off button, a shooting button, or a button for executing a connection with the external device.

In an embodiment, the communication circuit may be configured to transmit the control signal for controlling the external device through the antenna radiator 125 based on an instruction input thereto through the button portion 230.

Figure 1B:
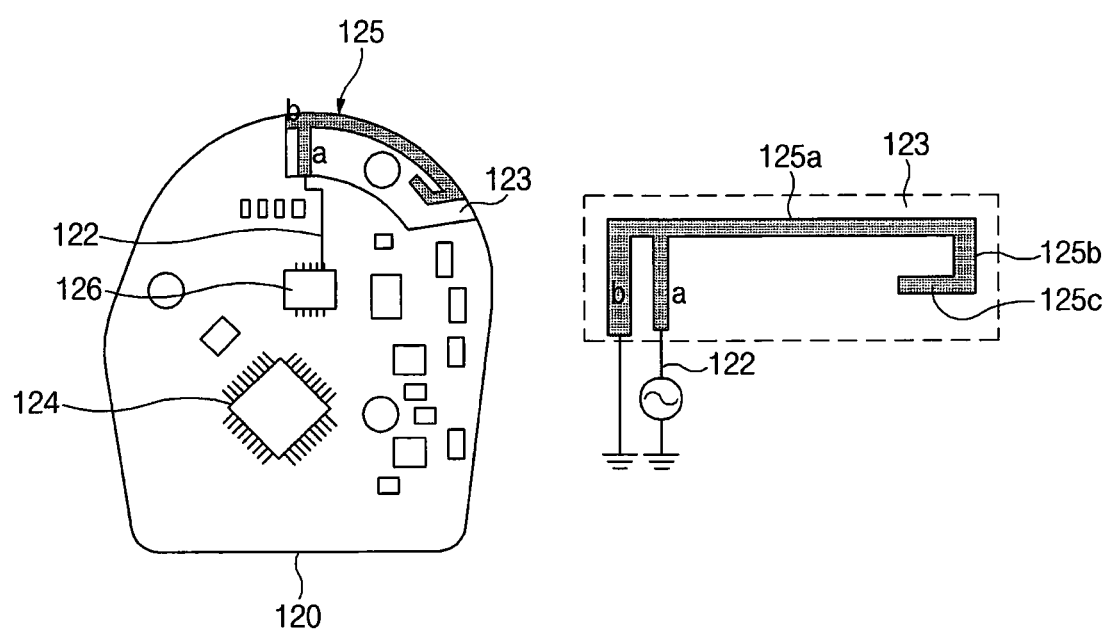
FIG. 1b is a front view showing a motor printed circuit board according to an embodiment of the present invention.
Figure 1C:
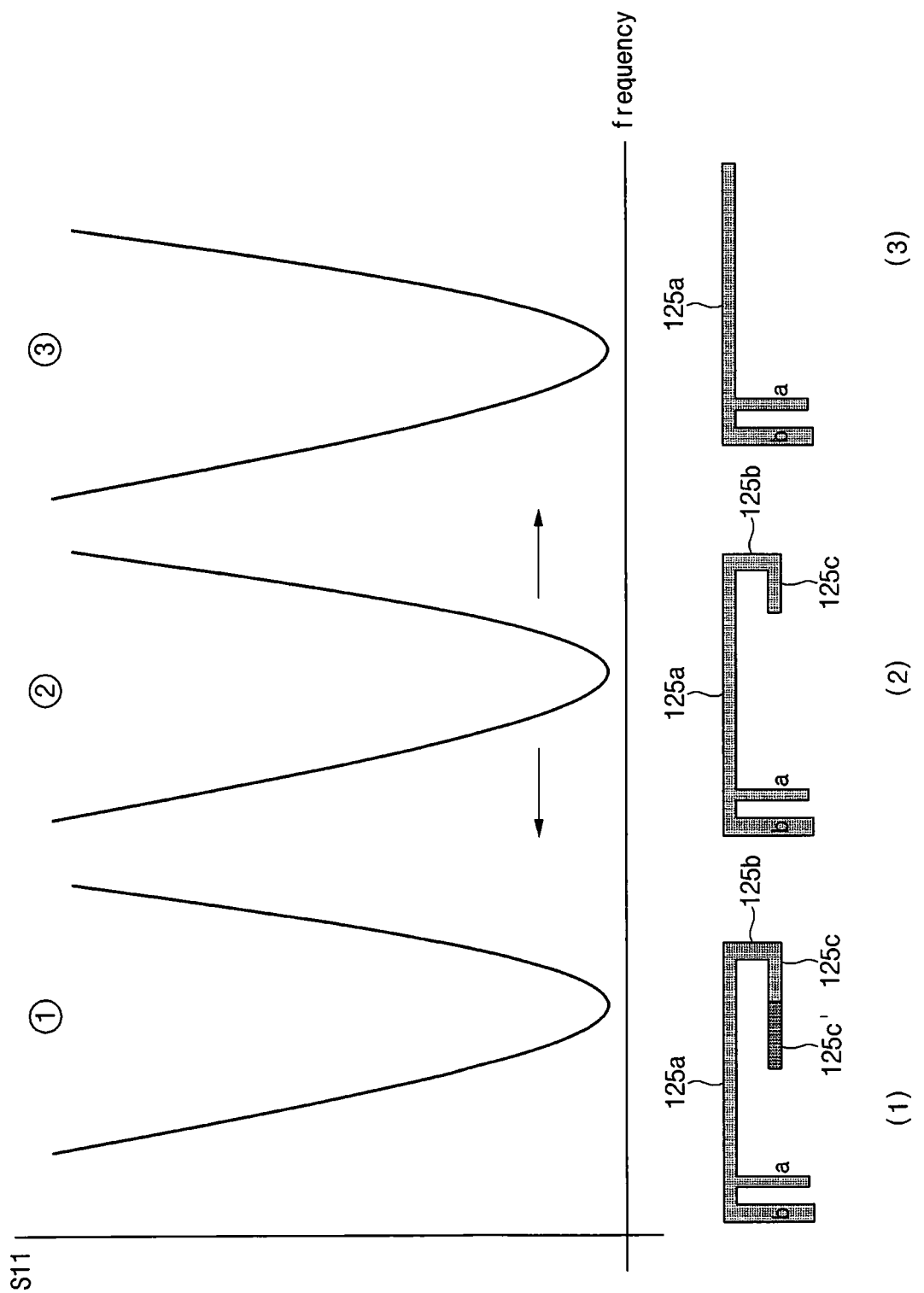
FIG. 1c is a view showing a conductive pattern and graphs of reflection loss according to various embodiments of the present invention.
Figure 1D:
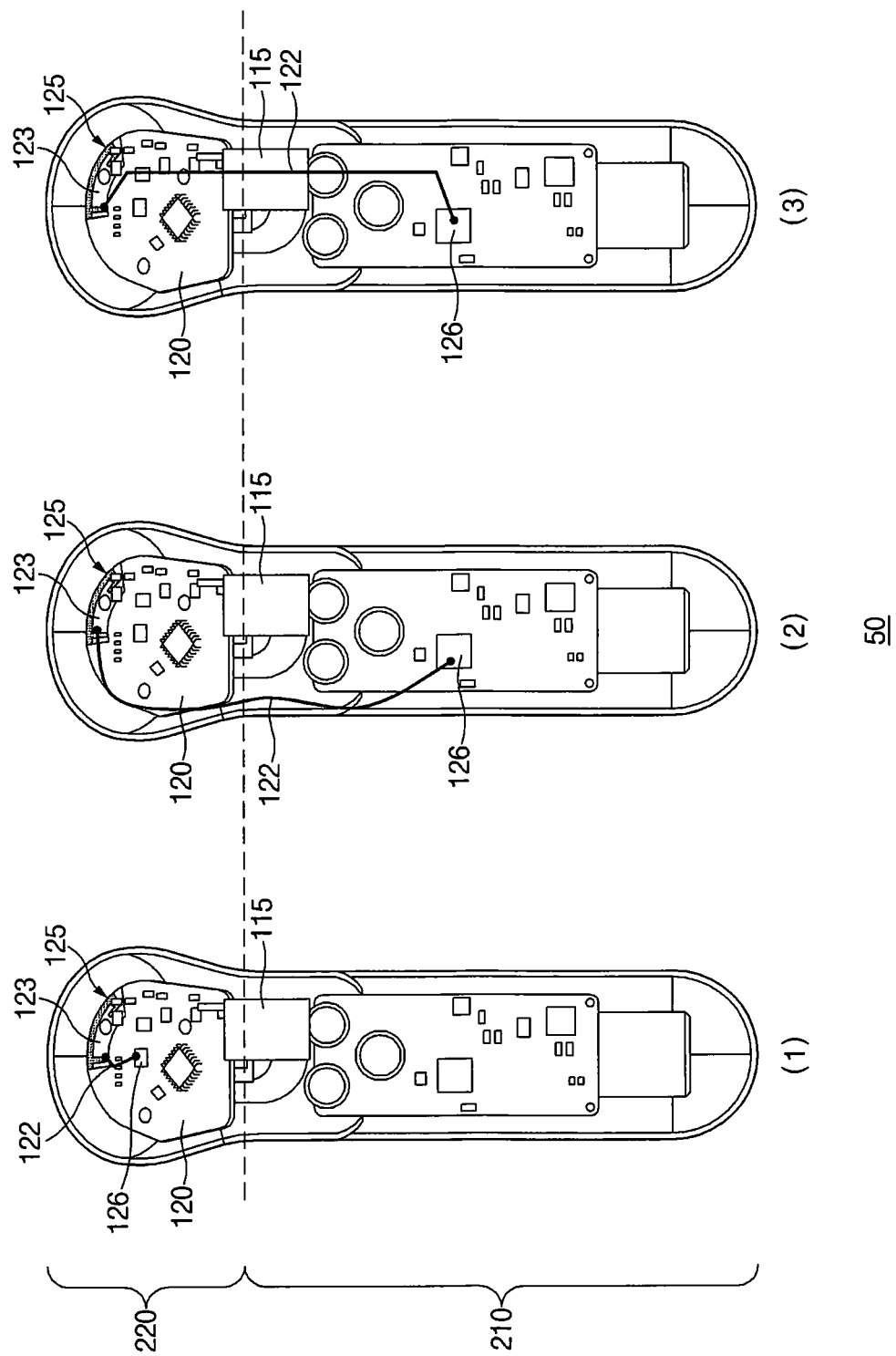
FIG. 1d is a view showing an electronic device according to various embodiments of the present invention.

FIG. 1b is a front view showing the motor PCB 120 according to an embodiment of the present invention. FIG. 1c is a view showing a conductive pattern and graphs of reflection loss according to various embodiments of the present invention. FIG. 1d is a view showing the electronic device 50 according to various embodiments of the present invention. Hereinafter, the embodiments will be described with reference to FIGS. 1b to 1d.

Referring to FIG. 1b, in an embodiment, at least a portion of the motor PCB 120 may include a non-conductive layer 123. The antenna radiator 125 may be disposed on the non-conductive layer 123.

In an embodiment, the antenna radiator 125 may be connected to a feeder line "a" and a ground line "b". The antenna radiator 125 may transmit and receive the communication signal to and from the communication circuit 126 via a transmission line 122 connected to the feeder line "a" and the communication circuit 126. For instance, the communication circuit 126 may be referred to as an "RF circuit" or a "BT module". In FIG. 1b, the communication circuit 126 is disposed in the motor PCB 120, however, the communication circuit 126 may be disposed in the main PCB (e.g., the main PCB 110 of FIG. 1a). Embodiments about arrangements of the communication circuit 126 will be described later with reference to FIG. 1d.

In an embodiment, the antenna radiator 125 may be operated as a reverse F-type antenna. For example, a resonance frequency and a bandwidth of the reverse F-type antenna may be controlled by structures of the feeder line "a" and the ground line "b".

The antenna radiator 125 may include a first portion 125a, a second portion 125b, and a third portion 125c. In an embodiment, the resonance frequency may be determined by the first portion 125a, the second portion 125b, and the third portion 125c of the antenna radiator 125. For example, a length of the first portion 125a, the second portion 125b, and the third portion 125c may be set to about ¼ lambda($\lambda$) length, and the resonance frequency may be controlled by adjusting the length of the second portion 125b and the third portion 125c.

Referring to FIG. 1c, for example, when the antenna radiator 125 has shapes of (1), (2), and (3), respectively, the graphs of reflection loss for antennas are shown. The shape of (1) may correspond to the antenna radiator 125 including the first portion 125a, the second portion 125b, and third, portions 125c and 125c'. The shape of (2) may correspond to the antenna radiator 125 including the first portion 125a, the second portion 125b, and the third portions 125c. The shape of (3) may correspond to the antenna radiator 125 including the first portion 125a. As the length of the antenna radiator 125 becomes shorter from the shape of (1) to the shape of (3), the resonance frequency may increase. In various embodiments, the antenna radiator 125 may have different patterns depending on a target frequency.

Referring to FIG. 1d, according to various embodiments, the communication circuit 126 may be disposed on the motor PCB 120 or the main PCB 110.

In various embodiments, the main PCB 110 and the motor PCB 120 may be connected to each other through a first FPCB 115. The motor PCB 120 may receive a power through the first FPCB 115, and a circuit of the main PCB 110 and a circuit of the motor PCB 120 may be electrically connected to each other through the first FPCB 115.

In an embodiment, referring to (1) of FIG. 1d, the communication circuit 126 may be disposed in an area other than the non-conductive layer 123 of the motor PCB 120. The antenna radiator 125 may be presented in the non-conductive layer 123 and connected to the communication circuit 126 via the transmission line 122.

In an embodiment, referring to (2) and (3) of FIG. 1d, the communication circuit 126 may be disposed on the main PCB 110.

For example, referring to (2) of FIG. 1d, the communication circuit 126 may be connected to the feeder line "a" of the antenna radiator 125 via an antenna cable (e.g., an RF cable) to reduce path loss. As another example, referring to (3) of FIG. 1d, the electronic device 50 may include the first FPCB 115 that connects the main PCB 110 and the motor PCB 120. The communication circuit 126 may be connected to the antenna radiator 125 via the transmission line 122 passing through a circuit disposed in the first FPCB 115.

Figure 1E:
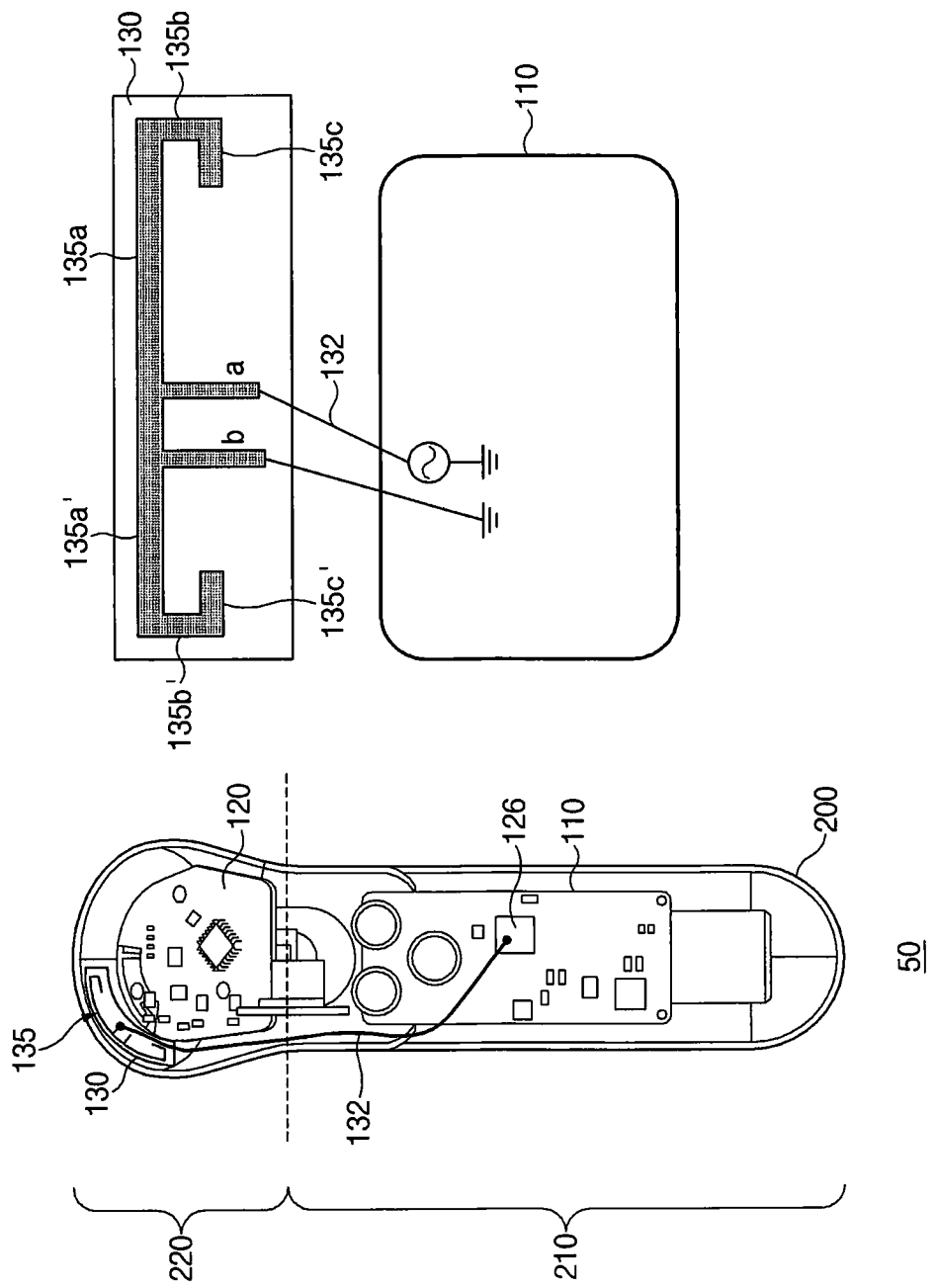
FIG. 1e is a view showing an electronic device and a conductive pattern formed on a flexible printed circuit board according to various embodiments of the present invention.

FIG. 1e is a view showing an electronic device and a conductive pattern formed on a flexible printed circuit board according to various embodiments.

Referring to FIG. 1e, in another embodiment, the electronic device 50 may further include a second FPCB 130 attached to one side of the motor PCB 120. The second FPCB 130 may be disposed in or attached to the connection portion 220.

For example, an antenna radiator 135 may be disposed on the second FPCB 130. The antenna radiator 135 disposed on the second FPCB 130 may be connected to the communication circuit 126 of the main PCB 110 via an antenna cable 132 (e.g., an RF cable) or via a strip line structure of the second FPCB 130.

As another example, the antenna radiator 135 disposed on the second FPCB 130 may be connected to the communication circuit 126 of the main PCB 110 via the transmission line (e.g., the transmission line 122 of (3) of FIG. 1d) crossing the circuit disposed in the first FPCB (e.g., the first FPCB 115 of (3) of FIG. 1d).

As another example, when the communication circuit 126 is disposed in an area rather than the non-conductive layer (e.g., the non-conductive layer 123 of FIG. 1d) of the motor PCB 120, the antenna radiator 135 may be connected to the communication circuit 126 of the motor PCB 120 via the transmission line 122.

FIG. 1e shows the electronic device 50 in which the antenna radiator 135 is connected to the communication circuit 126 via the antenna cable 132 as a representative example.

In an embodiment, the antenna radiator 135 may be connected to the feeder line "a" and the ground line "b". The antenna radiator 135 may transmit and receive the communication signal to and from the communication circuit 126 via the feeder line "a" and the antenna cable 132 connected to the communication circuit 126. As a representative example, the electronic device 50 in which the antenna radiator 135 is connected to the communication circuit 126 of the main PCB 110 via the antenna cable 132 is illustrated.

For example, the antenna radiator 135 may include first portions 135a and 135a', second portions 135b and 135b', and third portions 135c and 135c'. The resonance frequency may be determined by the first portions 135a and 135a', the second portions 135b and 135b', and the third portions 135c and 135c' of the antenna radiator 135.

In various embodiments, the electronic device 50 may include the antenna radiator 125 disposed in the motor PCB 120 and/or the antenna radiator 135 disposed in the second FPCB 130.

Figure 2A:
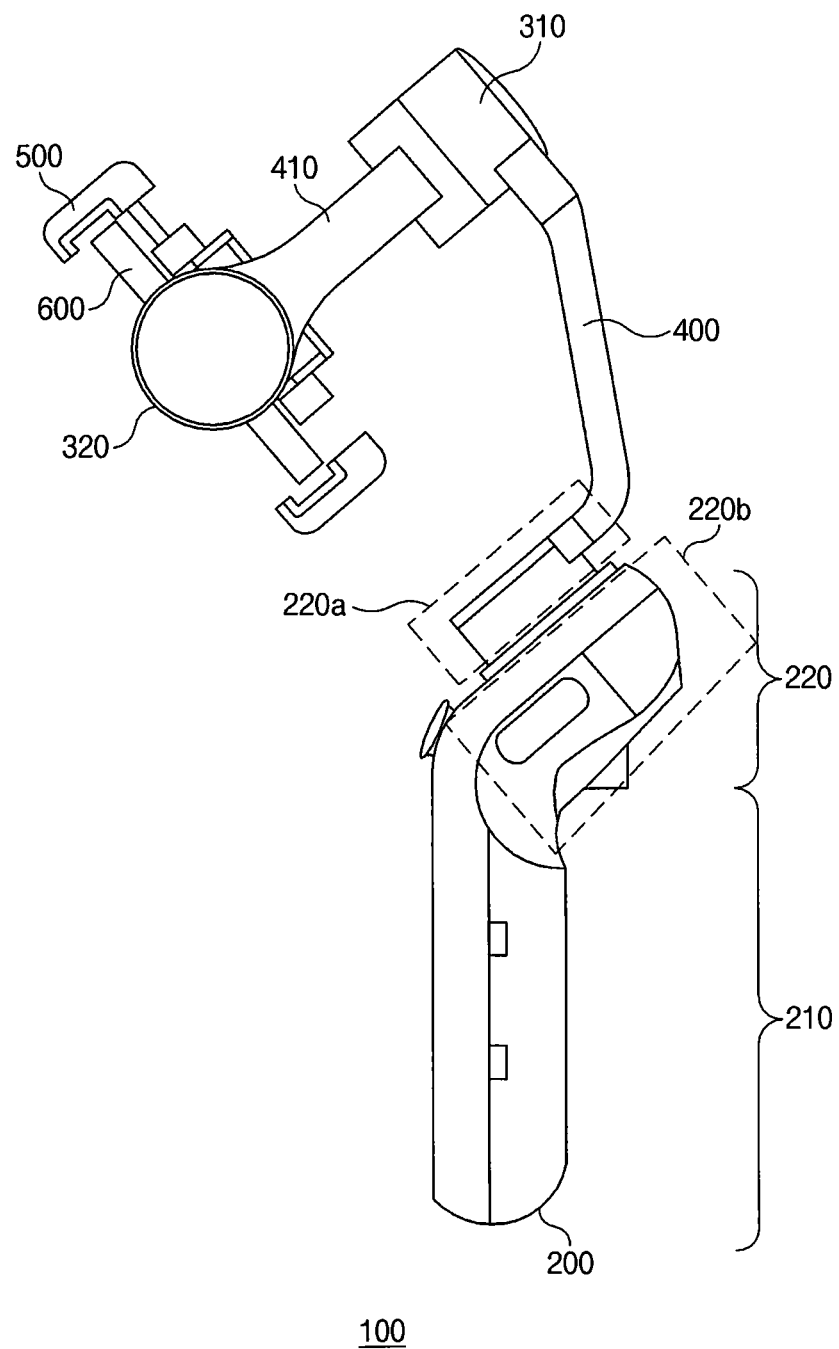
FIG. 2a is a perspective view showing an electronic device according to an embodiment of the present invention.
Figure 2B:
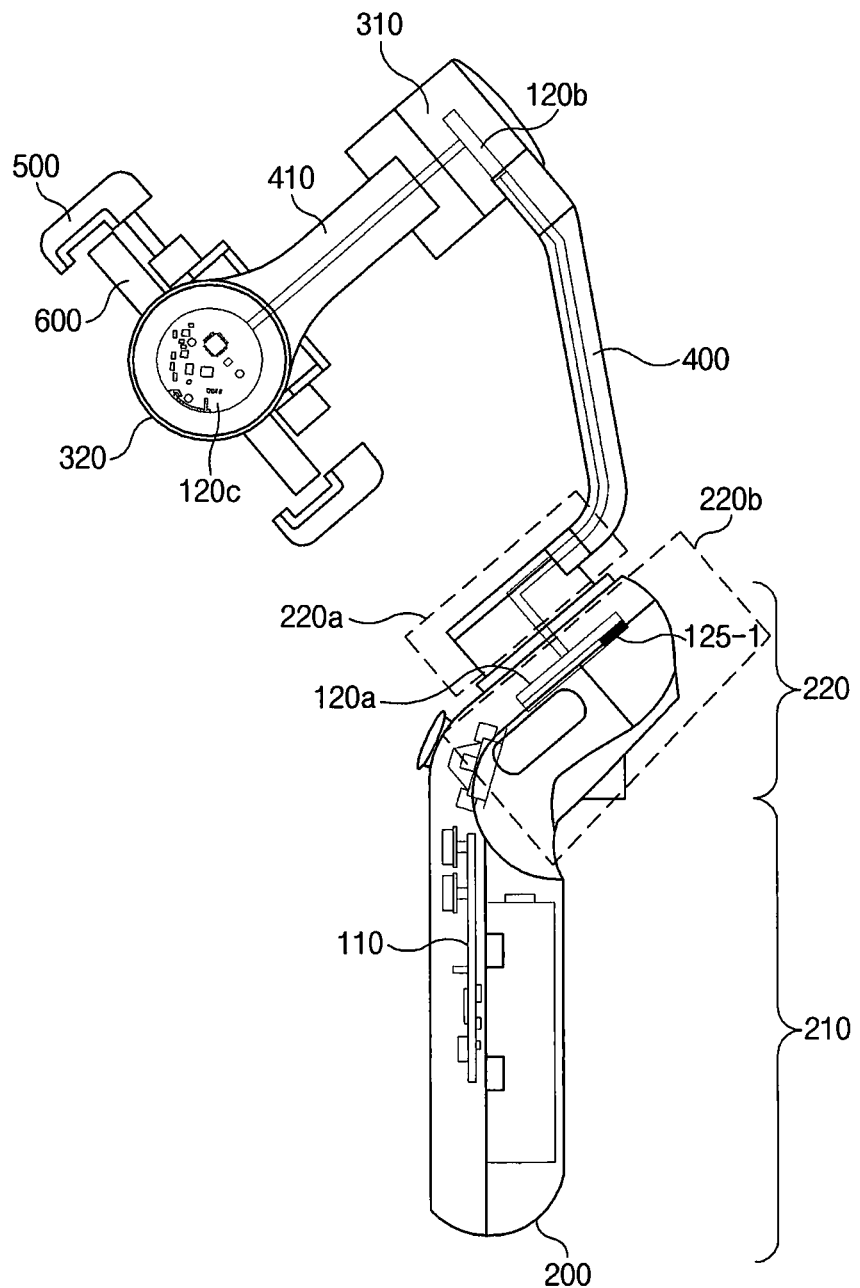
FIG. 2b is a perspective view showing an electronic device according to an embodiment of the present invention.
Figure 2C:
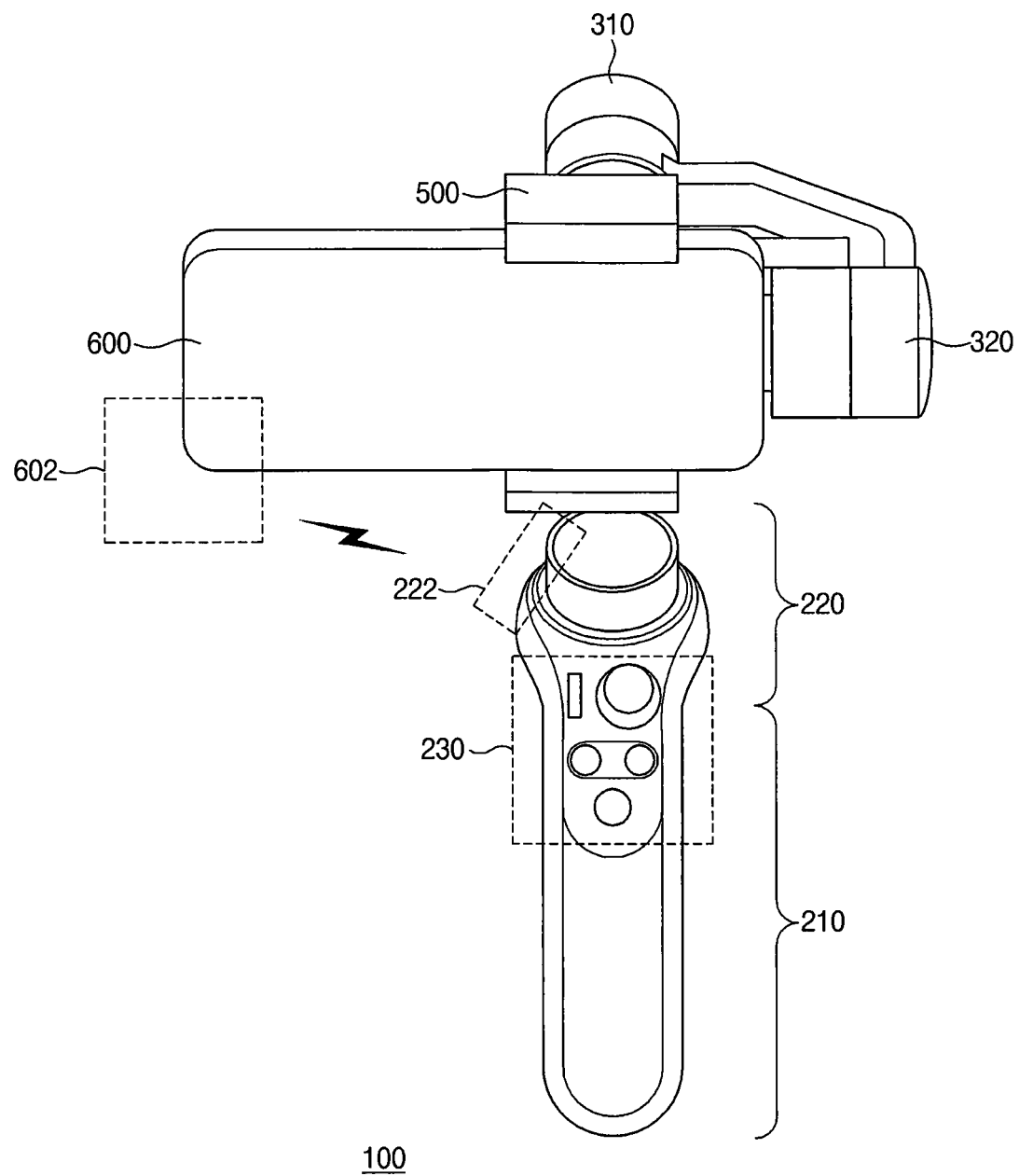
FIG. 2c is a front view showing an electronic device according to an embodiment of the present invention.
Figure 2D:
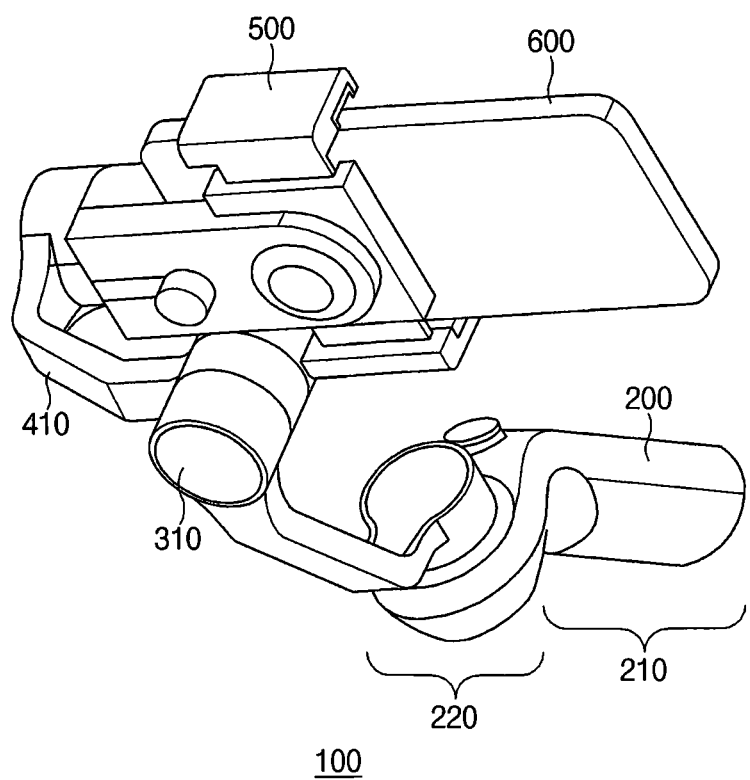
FIG. 2d is a rear view showing an electronic device according to an embodiment of the present invention.

FIG. 2a is a perspective view showing an electronic device 100 according to an embodiment of the present invention. FIG. 2b is a perspective view showing the electronic device 100 according to an embodiment of the present invention. FIG. 2c is a front view showing the electronic device 100 according to an embodiment of the present invention. FIG. 2d is a rear view showing the electronic device 100 according to an embodiment of the present invention.

Referring to FIGS. 2a to 2d, the electronic device 100 according to another exemplary embodiment of the present invention may include a main body unit 210 (e.g., the grip portion 210 of FIG. 1a), a first joint portion 220 (e.g., the connection portion 220 of FIG. 1a), and a first sub-body unit 400.

For example, the main body unit 210 and a portion 220b of the first joint portion 220 (e.g., the connection portion 220 of FIG. 1a) may correspond to the electronic device 50 of FIG. 1a. For instance, the other portion 220a of the first joint portion 220 and a first sub-body portion 400 may be included in the support member of FIG. 1a.

According to an embodiment, the main body unit 210 may include a grip area for gripping by the user. For instance, the main body unit 210 may correspond to a handle of the electronic device 100. The user may grip the grip area of the main body unit 210 by his/her hand.

According to an embodiment, the electronic device 100 may include the first joint portion 220 disposed at or connected to one end of the main body unit 210. The first sub-body unit 400 may be connected to the main body unit 210 by the first joint portion 220.

According to an embodiment, the main body unit 210 may include a main PCB 110 (e.g., the main PCB 110 of FIG. 1*a*) including a processor (e.g., the processor 121 of FIG. 1*a*). The first joint portion 220 may include a first motor PCB 120*a* (e.g., the motor PCB 120 of FIG. 1*a*) including a control circuit (e.g., the control circuit 124 of FIG. 1*b*) and a first antenna radiator 125-1 (e.g., the antenna radiator 125 of FIG. 1*a*) and being electrically connected to the main PCB 110.

According to an embodiment, the processor of the main PCB 110 may be configured to allow the control circuit of the first motor PCB 120*a* to control the first sub-body unit 400 connected via the first joint portion 220.

According to an embodiment, the electronic device 100 may include a communication circuit (e.g., the communication circuit 126 of FIGS. 1*b* and 1*d*) electrically connected to the first antenna radiator 125-1. For example, the communication circuit may include a communication processor and an RF circuit. For instance, the communication circuit may be disposed on the main PCB 110 or the first motor PCB 120*a*.

According to an embodiment, the communication circuit may be configured to transmit and receive a signal to and from an external device via the first antenna radiator 125-1 of the first motor PCB 120*a*. For example, the communication circuit may be configured to transmit and receive the signal to and from the external device via the first antenna radiator 125-1. The antenna radiator may be disposed in an area rather than the grip area, and thus the performance of the antenna may be improved.

According to an embodiment, the communication circuit may be configured to perform a short-range communication with the external device using the first antenna radiator 125-1. For instance, the electronic device 100 may transmit or receive a signal for controlling the external device via a Bluetooth communication.

According to an embodiment, at least a portion of the first joint portion 220 may be formed of a non-conductive material. Since a conductive material interferes with radiation of the antenna, the antenna of the electronic device 100 may be disposed in the first joint portion 220, at least a portion of which is formed of the non-conductive material, and thus the radiation performance of the antenna may be improved.

According to an embodiment, the electronic device 100 may further include a second joint portion 310 connected to a portion of the first sub-body unit 400 and a second sub-body unit 410 connected to the first sub-body unit 400 by the second joint portion 310.

According to an embodiment, the electronic device 100 may further include a third joint portion 320 connected to a portion of the second sub-body unit 410 and a mounting portion 500 connected to the second sub-body unit 410 by the third joint portion 320.

For example, at least a portion of the support member including the second joint portion 310, the third joint portion 320, the first sub-body unit 400, the second sub-body unit 410, and the mounting portion 500 may include or may be formed of a metal material.

For example, the mounting portion 500 may have a structure to fix the external device 600 to the electronic device 100. The mounting portion 500 may be included in the support member of FIG. 1*a*. As an example, the external device may include a device capable of shooting, such as a camera, a camcorder, or a smartphone. The electronic device 100 may be used as a shooting aid.

In an embodiment, the third joint portion 320 may include a third motor PCB 120*c* including a control circuit. The processor of the main PCB 110 may allow the control circuit of the third motor PCB 120*c* to control the mounting portion 500.

In an embodiment, the processor of the main PCB 110, the first motor PCB 120*a*, a second motor PCB 120*b*, and the third motor PCB 120*c* may be electrically connected to each other.

In various embodiments, the communication circuit may be configured to perform a short-range communication with the external device fixed to the mounting portion 500 using the first antenna radiator 125-1. For instance, the electronic device 100 may transmit a signal for controlling the camera through the Bluetooth communication.

FIG. 2*c* shows the electronic device 100 in which the external device 600 (e.g., a smartphone) is fixed to the mounting portion 500. The external device 600 may include an antenna element 602 to communicate with the electronic device 100. For example, the antenna element 602 of the external device 600 may perform the Bluetooth communication with an antenna element 222 of the electronic device 100 including the first antenna radiator 125-1. As an example, the communication circuit may transmit and receive the control signal for controlling the external device 600 via the first antenna radiator 125-1.

In an embodiment, the main body unit 210 and/or the first joint portion 220 may further include the button portion 230 for controlling the external device 600 coupled to the electronic device 100 through the first joint portion 220.

For example, the button portion 230 may include, for example, a power on/off button with respect to the electronic device 100 or the external device 600, a shooting button, or a button for executing a connection with the external device 600.

In an embodiment, the communication circuit may be configured to transmit the control signal for controlling the external device 600 through the first antenna radiator 125-1 based on an instruction input thereto through the button portion 230.

In another embodiment, the electronic device 100 may include a first structure including the mounting portion 500 that detachably holds the external device 600 including a camera and a first short-range wireless communication circuit and a second structure connected to the first structure.

For example, the first structure may be referred to as the portion 220*a* of the first joint portion 220 and the first body portion 400. The second structure (e.g., the electronic device 50 of FIG. 1*a*) may be referred to as the main body unit 210 and the other portion 220*b* of the first joint portion 220 (e.g., the connection portion 220 of FIG. 1*a*).

In another embodiment, the second structure may include a motor provided to rotate the first structure and a user control interface placed at the second structure. For instance, the user control interface may be referred to as the button portion 230 for controlling the electronic device 100 or the external device 600. As an example, the motor may be disposed closer to the first structure than the user control interface.

In another embodiment, the second structure may include a first PCB 120*a*. The first PCB 120*a* may include a control circuit configured to control the motor, a conductive pattern 125-1 disposed on and/or in the first PCB 120*a*, and a second short-range wireless communication circuit electrically connected to the conductive pattern 125-1.

For example, the second structure may include a second PCB 120b, and the second short-range wireless communication circuit may be disposed on and/or in the second PCB 120b.

The electronic device 100 according another embodiment may further include a cable (e.g., the transmission line 122 of FIG. 1d) electrically connected between the second short-range wireless communication circuit and the conductive pattern 125-1. For example, the second short-range wireless communication circuit may be configured to support the Bluetooth communication.

Figure 3:
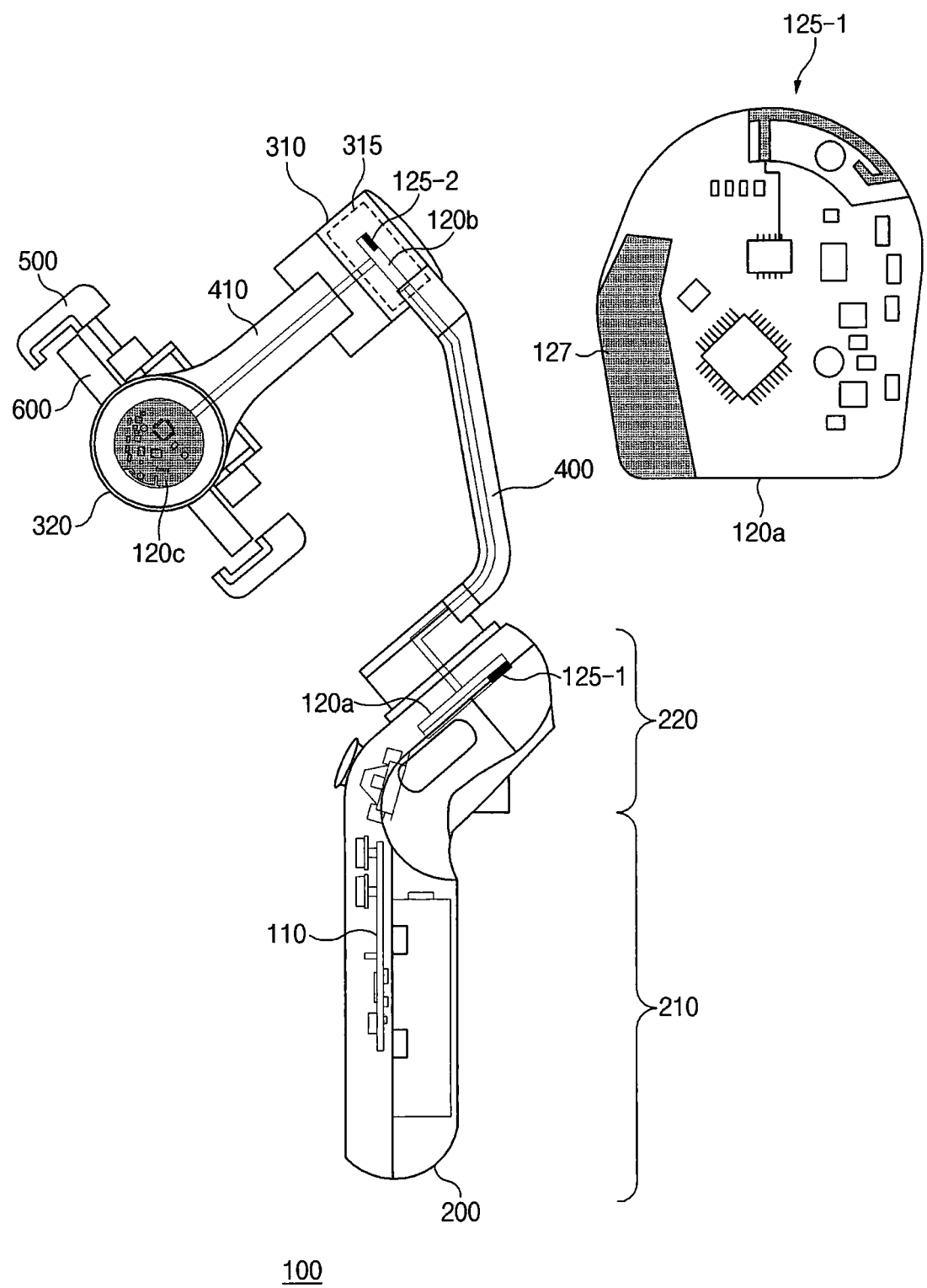
FIG. 3 is a perspective view showing an electronic device according to an embodiment of the present invention.

FIG. 3 is a perspective view showing an electronic device according to an embodiment of the present invention. In FIG. 3, the same descriptions as those in FIGS. 2a to 2d will be omitted.

Referring to FIGS. 2a and 3, the second joint portion 310 of the electronic device 100 may include the second motor PCB 120b including the control circuit and a second antenna radiator 125-2.

In an embodiment, the processor of the main PCB 110 may be configured to allow the control circuit of the second motor PCB 120b to control the second sub-body unit 410.

In various embodiments, the antenna element included in the second motor PCB 120b may be referred to a laser direct structuring (LDS) antenna, an in-molding antenna (IMA) or a PCB embedded antenna (PEA).

In various embodiments, the second joint portion 310 may include the second motor PCB 120b including the control circuit and the FPCB including the antenna element and being connected to the second motor PCB 120b.

Hereinafter, the PEA formed in the second motor PCB 120b will be described as the antenna element mounted on the second joint portion 310, but the antenna element mounted on the second joint portion 310 should not be limited to the PEA.

In an embodiment, the second motor PCB 120b may include the second antenna radiator 125-2. The second antenna radiator 125-2 may be referred to as a conductive pattern.

In an embodiment, the communication circuit may be configured to transmit and receive the signals to and from the external device through the second antenna radiator 125-2 of the second motor PCB 120b. For instance, the communication circuit may be electrically connected to the second antenna radiator 125-2. The communication circuit may be connected to the second antenna radiator 125-2 through the antenna cable (e.g., the RF cable).

In an embodiment, at least a portion of the support member including the second joint portion 310, the third joint portion 320, the first sub-body unit 400, the second sub-body unit 410, and the mounting portion 500 may include or may be formed of a metal material.

In an embodiment, at least a portion of the second joint portion 310 may include an injection member 315. The signals transmitted or received through the second antenna radiator 125-2 may be transmitted or received to or from the outside through the injection member 315.

In an embodiment, the communication circuit may perform two different communications from each other using the first antenna radiator 125-1 (e.g., the antenna radiator 125 of FIG. 1a) of the first motor PCB 120a (e.g., the motor PCB 120 of FIG. 1a) and the second antenna radiator 125-2 of the second motor PCB 120b.

For example, the first antenna radiator 125-1 may be referred to as the conductive pattern formed in the first motor PCB 120a. The second antenna radiator 125-2 may be referred to as the conductive pattern formed in the second motor PCB 120b. The first antenna radiator 125-1 and the second antenna radiator 125-2 may have different patterns from each other depending on the target frequency.

In an embodiment, the communication circuit may perform the Bluetooth communication with the external device 600 coupled to the electronic device 100 using the first antenna radiator 125-1 and may perform a WiFi communication, a cellular communication, or an LTE communication using the second antenna radiator 125-2. For example, the electronic device 100 may control the external device 600 coupled to the electronic device 100 through the Bluetooth communication using the first antenna radiator 125-1. As another example, the electronic device 100 may transmit and receive data to and from the external device 600 or another external device (e.g., the server) through the WiFi communication, the cellular communication, or the LTE communication using the second antenna radiator 125-2.

In various embodiments, antenna elements may be respectively mounted on the joint portions included in the support member of the electronic device 100. For instance, the antenna elements may be implemented in parallel.

The electronic device 100 according to various embodiments may further include the third joint portion 320 connected to the portion of the second sub-body unit 410 and the mounting portion 500 connected to the second sub-body unit 410 by the third joint portion 320.

In an embodiment, the third joint portion 320 may include the third motor PCB 120c including the control circuit. The processor of the main PCB 110 may allow the control circuit of the third motor PCB 120c to control the mounting portion 500.

In an embodiment, the processor of the main PCB 110, the first motor PCB 120a, the second motor PCB 120b, and the third motor PCB 120c may be electrically connected to each other. For example, the processor of the main PCB 110 may be electrically connected to the first motor PCB 120a via a signal line or a cable, the first motor PCB 120a may be electrically connected to the second motor PCB 120b via the signal line or the cable, and the second motor PCB 120b may be electrically connected to the third motor PCB 120c via the signal line or the cable.

The processor of the main PCB 110 may control the control circuit of the first motor PCB 120a, the control circuit of the second motor PCB 120b, and the control circuit of the third motor PCB 120c such that a shaking of the image taken by the external device 600 fixed to the mounting portion 500 is reduced.

For example, the electronic device 100 may measure the rotation direction or the inclined angle of the external device 600 using various sensors, e.g., an acceleration sensor or a gyro sensor. The processor of the electronic device 100 may control the control circuits of the first motor PCB 120a, the second motor PCB 120b, and the third motor PCB 120c such that the lens of the external device 600 maintains a level horizon and faces the subject regardless of the movement and inclination of the external device 600.

For instance, the third motor PCB 120c may not include the antenna radiator. The signal loss may occur in the signal provided from the communication circuit through the transmission line (e.g., the transmission line 122 of FIG. 1a). Accordingly, the antenna may not be mounted on the third joint portion 320 placed relatively farther away from the main body unit 210. The antenna may be mounted on the first joint portion 220 and the second joint portion 310 placed relatively closer to the main body unit 210.

In various embodiments, an antenna element 127 for the LTE communication may be disposed in the first motor PCB 120*a* to minimize the path loss.

According to an embodiment, the electronic device 100 may include a plurality of antennas, and the antennas may be arranged to prevent the antennas from interfering with each other. For instance, when the first antenna radiator 125-1 is an antenna radiator for the Bluetooth communication, the antenna element 127 may be disposed spaced apart from the first antenna radiator 215-1 by about 20 mm in order to prevent the interference phenomenon.

The electronic device 100 shown in FIGS. 2*a* to 2*d* and 3 includes two sub-body units, but the number of the sub-body units should not be limited to two. That is, the electronic device 100 may include a plurality of sub-body units and a plurality of joint portions. The antenna may be mounted on each motor PCB disposed on the joint portions.

Figure 4:
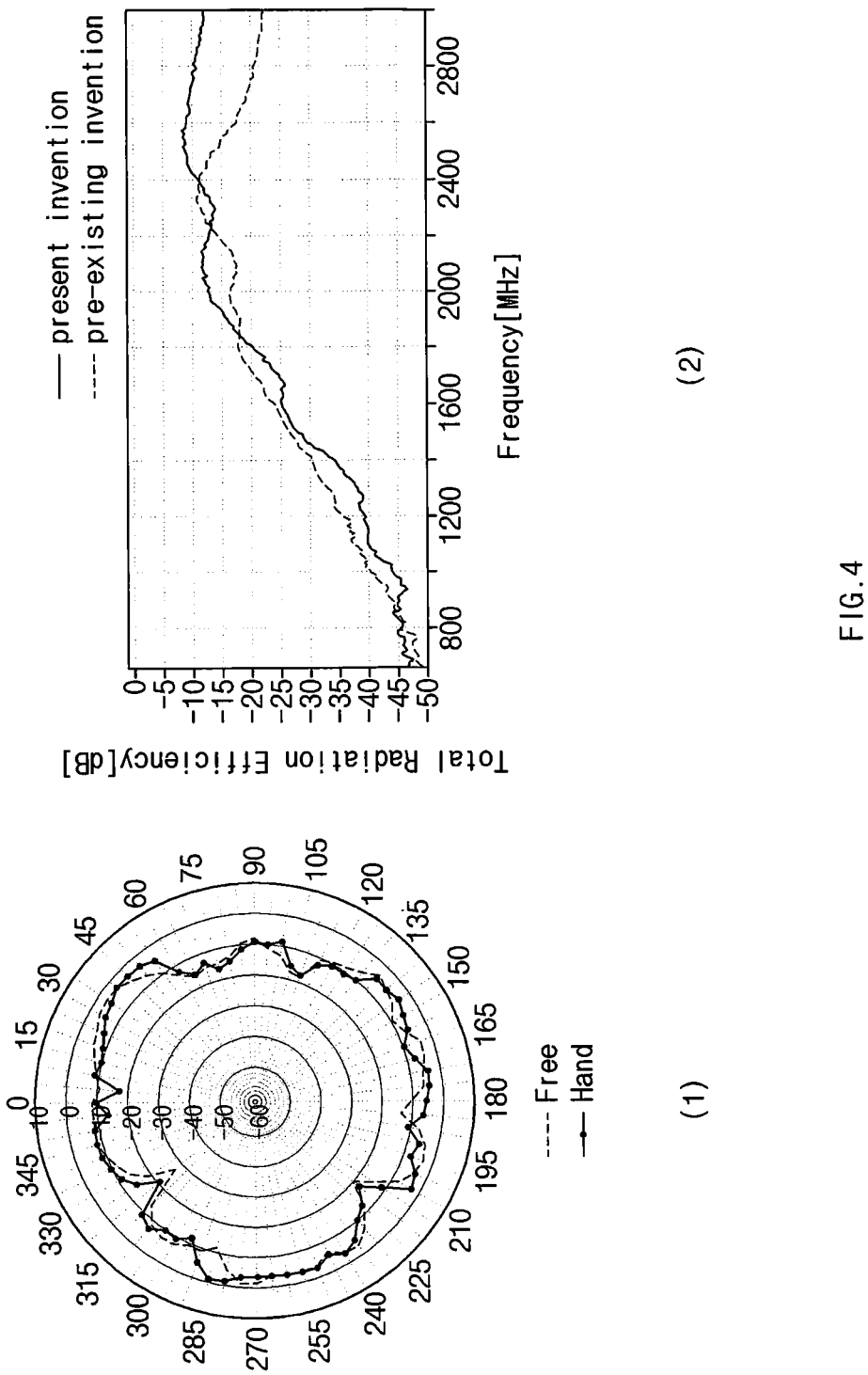
FIG. 4 is a graph showing a performance of an antenna of an electronic device according to an embodiment of the present invention.

FIG. 4 is a graph showing the performance of the antenna of the electronic device according to an embodiment of the present invention.

Referring to FIG. 4, a graph (1) shows a beam pattern for measuring the performance of the antenna when the electronic device (e.g., the electronic device 100 of FIG. 2*a*) performs the Bluetooth communication with the external device (e.g., the external device 600 of FIG. 2*a*) connected to the electronic device.

When comparing the beam pattern obtained while the user does not grip with the beam pattern obtained while the user grips, it may be seen that the performance of the antenna is not degraded. As an example, the wireless connection between the electronic device and the external device may be prevented from being disconnected in a crowded environment with short-range communication signals.

A graph (2) shows an efficiency of Bluetooth antenna of the electronic device. The antenna efficiency of an electronic device (a conventional art) with an antenna mounted in a grip area is indicated by a dotted line. The antenna efficiency of the electronic device (e.g., the electronic device 100 of FIG. 2*a*, the present invention) with the antenna mounted in the area rather than the grip area is indicated by a solid line.

The performance of the electronic device of the conventional art may be degraded when the grip area is gripped. The performance of the electronic device of the present inventive concept may not be degraded. Referring to the graph (2), it may be seen that the efficiency of the electronic device of the present invention is superior than that of the electronic device of the conventional art by about 6 dB in a frequency range from about 2400 MHz to about 2480 MHz in which a Bluetooth communication frequency is included.

In various embodiments of the present invention, the electronic device (e.g., the electronic device 50 of FIG. 1*a*, the electronic device 100 of FIG. 2*a*) may include the main body unit (e.g., the grip portion 210 of FIG. 1*a* and the main body unit 210 of FIG. 2*a*) including the grip area for gripping by the user, the first joint portion (e.g., the connection portion 220 of FIG. 1*a* and the first joint portion 220 of FIG. 2*a*) formed at or connected to one end of the main body unit, the first sub-body unit (e.g., the first sub-body unit 400 of FIG. 2*a*) connected to the main body unit by the first joint portion, and the communication circuit, the main body unit may include the main PCB including the processor (e.g., the processor 121 of FIG. 1*a*), the first joint portion may include the first motor PCB (e.g., the motor PCB 120 of FIG. 1*a* and the first motor PCB 120*a* of FIG. 2*a*) including the control circuit (e.g., the control circuit 124 of FIG. 1*b*) and the first antenna radiator (e.g., the antenna radiator 125 of FIG. 1*a* and the first antenna radiator 125-1 of FIG. 2*a*) and being electrically connected to the main PCB, the processor may be configured to allow the control circuit of the first motor PCB to control the first sub-body unit connected by the first joint portion, and the communication circuit may be configured to transmit and receive the signals to and from the external device (e.g., the external device 600 of FIG. 2*a*) via the first antenna radiator of the first motor PCB.

In various embodiments of the present invention, the communication circuit of the electronic device (e.g., the electronic device 50 of FIG. 1*a* and the electronic device 100 of FIG. 2*a*) may be configured to transmit and receive the signals to and from the external device via the first antenna radiator.

In various embodiments of the present invention, the communication circuit of the electronic device (e.g., the electronic device 50 of FIG. 1*a* and the electronic device 100 of FIG. 2*a*) may be configured to perform the Bluetooth communication using the first antenna radiator.

In various embodiments of the present invention, at least the portion of the first joint portion of the electronic device (e.g., the electronic device 50 of FIG. 1*a* and the electronic device 100 of FIG. 2*a*) may be formed of the non-conductive material.

In various embodiments of the present invention, the electronic device (e.g., the electronic device 50 of FIG. 1*a* and the electronic device 100 of FIG. 2*a*) may further include the second joint portion (e.g., the second joint portion 310 of FIG. 2*a*) connected to the portion of the first sub-body unit and the second sub-body unit (e.g., the second sub-body unit 410 of FIG. 2*a*) connected to the first sub-body unit by the second joint portion, the second joint portion may include the second motor PCB (e.g., the second motor PCB 120*b* of FIG. 2*a*) including the control circuit and the second antenna radiator (e.g., the second antenna radiator 125-2 of FIG. 2*a*) and being electrically connected to the main PCB, the processor may be configured to allow the control circuit of the second motor PCB to control the second sub-body unit, and the communication circuit may be electrically connected to the second antenna radiator and configured to transmit and receive the signals to and from the external device via the second antenna radiator of the second motor PCB.

In various embodiments of the present invention, at least the portion of the second joint portion of the electronic device (e.g., the electronic device 50 of FIG. 1*a* and the electronic device 100 of FIG. 2*a*) may include the injection member.

In various embodiments of the present invention, the electronic device (e.g., the electronic device 50 of FIG. 1*a* and the electronic device 100 of FIG. 2*a*) may further include the third joint portion (e.g., the third joint portion 320 of FIG. 2*a*) connected to the portion of the second sub-body unit and the mounting portion (e.g., the mounting portion 500 of FIG. 2*a*) connected to the second sub-body unit by the third joint portion, the third joint portion may include the third motor PCB (e.g., the third motor PCB of FIG. 2*b*) including the control circuit and being electrically connected to the main PCB, and the processor may be configured to allow the control circuit of the third motor PCB to control the mounting portion.

In various embodiments of the present invention, the processor of the electronic device may control the control circuit of the first motor PCB, the control circuit of the second motor PCB, and the control circuit of the third motor PCB such that the shaking of the image taken by the camera fixed to the mounting portion is reduced.

In various embodiments of the present invention, the communication circuit of the electronic device (e.g., the electronic device 50 of FIG. 1a and the electronic device 100 of FIG. 2a) may be configured to transmit and receive the signals to and from the camera fixed to the mounting portion via the first antenna radiator.

In various embodiments of the present invention, the communication circuit of the electronic device (e.g., the electronic device 50 of FIG. 1a and the electronic device 100 of FIG. 2a) may be configured to transmit the control signal to the camera via the first antenna radiator to control the camera.

In various embodiments of the present invention, the communication circuit of the electronic device (e.g., the electronic device 50 of FIG. 1a and the electronic device 100 of FIG. 2a) may be configured to perform the WiFi communication, the cellular communication, or the LTE communication via the second antenna radiator.

In various embodiments of the present invention, the electronic device (e.g., the electronic device 50 of FIG. 1a and the electronic device 100 of FIG. 2a) may include the housing including the grip portion (e.g., the grip portion 210 of FIG. 1a) and the connection portion (e.g., the connection portion 220 of FIG. 1a) to which the support member capable of being connected to the electronic device is connected, the main PCB (e.g., the main PCB 110 of FIG. 1a) disposed in the grip portion and including the processor, the motor PCB (e.g., the motor PCB 120 of FIG. 1a) disposed in the connection portion, including the control circuit (e.g., the control circuit 124 of FIG. 1a) and the antenna radiator (e.g., the antenna radiator 125 of FIG. 1a), and electrically connected to the main PCB, and the communication circuit electrically connected to the antenna radiator, the processor may be configured to allow the control circuit of the motor PCB to control the movement of the support member connected to the housing by the connection portion, and the communication circuit may be configured to transmit and receive the signals to and from the external device coupled to the support member via the antenna radiator of the motor PCB.

In various embodiments of the present invention, the housing of the electronic device (e.g., the electronic device 50 of FIG. 1a and the electronic device 100 of FIG. 2a) may further include a button portion (e.g., the button portion 230 of FIG. 1a) to control the external device.

In various embodiments of the present invention, the communication circuit of the electronic device (e.g., the electronic device 50 of FIG. 1a and the electronic device 100 of FIG. 2a) may be configured to transmit the control signal used to control the external device through the antenna radiator based on the instruction input thereto through the button portion.

In various embodiments of the present invention, the connection portion of the housing of the electronic device (e.g., the electronic device 50 of FIG. 1a and the electronic device 100 of FIG. 2a) may be formed of the non-conductive material.

In various embodiments of the present invention, the communication circuit of the electronic device (e.g., the electronic device 50 of FIG. 1a and the electronic device 100 of FIG. 2a) may be configured to transmit and receive the signals to and from the external device only through the antenna radiator of the motor PCB.

In various embodiments of the present invention, the electronic device (e.g., the electronic device 50 of FIG. 1a and the electronic device 100 of FIG. 2a) may include a first structure including the mounting portion (e.g., the mounting portion 500 of FIG. 2b) that detachably holds the external device (e.g., the external device 600 of FIG. 2b) including the camera and the first short-range wireless communication circuit and a second structure connected to the first structure, the second structure may include a motor provided to rotate the first structure, a user control interface placed at the second structure such that the motor is disposed closer to the first structure than the user control interface, the first PCB (e.g., the first PCB 120a of FIG. 2b) including the control circuit configured to control the motor and the conductive pattern (e.g., the conductive pattern 125-1 of FIG. 2b) formed on and/or in the first PCB, and the second short-range wireless communication circuit electrically connected to the conductive pattern.

In various embodiments of the present invention, the second structure of the electronic device (e.g., the electronic device 50 of FIG. 1a, the electronic device 100 of FIG. 2a) may include the second PCB (e.g., the second PCB 120b of FIG. 2b), and the second short-range wireless communication circuit may be disposed on and/or in the second PCB.

In various embodiments of the present invention, the electronic device may further include the cable electrically connected between the second short-range wireless communication circuit and the conductive pattern.

In various embodiments of the present invention, the second short-range wireless communication circuit of the electronic device (e.g., the electronic device 50 of FIG. 1a, the electronic device 100 of FIG. 2a) may be configured to support the Bluetooth communication.

Various embodiments of the present disclosure and terms used herein are not intended to limit the technologies described in the present disclosure to specific embodiments, and it should be understood that the embodiments and the terms include modification, equivalent, and/or alternative on the corresponding embodiments described herein. With regard to description of drawings, similar components may be marked by similar reference numerals. The terms of a singular form may include plural forms unless otherwise specified. In the disclosure disclosed herein, the expressions "A or B", "at least one of A and/or B", "A, B, or C", or "at least one of A, B, and/or C", and the like used herein may include any and all combinations of one or more of the associated listed items. Expressions such as "first," or "second," and the like, may express their components regardless of their priority or importance and may be used to distinguish one component from another component but is not limited to these components. When an (e.g., first) component is referred to as being "(operatively or communicatively) coupled with/to" or "connected to" another (e.g., second) component, it may be directly coupled with/to or connected to the other component or an intervening component (e.g., a third component) may be present.

According to the situation, the expression "adapted to or configured to" used herein may be interchangeably used as, for example, the expression "suitable for", "having the capacity to", "changed to", "made to", "capable of" or "designed to" in hardware or software. The expression "a device configured to" may mean that the device is "capable of" operating together with another device or other parts. For example, a "processor configured to (or set to) perform A, B, and C" may mean a dedicated processor (e.g., an embedded processor) for performing corresponding operations or a generic-purpose processor (e.g., a central processing unit (CPU) or an application processor (AP)) which performs corresponding operations by executing one or more software programs which are stored in a memory device.

The term "module" used herein may include a unit, which is implemented with hardware, software, or firmware, and may be interchangeably used with the terms "logic", "logical block", "part", "circuit", or the like. The "module" may be a minimum unit of an integrated part or a part thereof or may be a minimum unit for performing one or more functions or a part thereof. The "module" may be implemented mechanically or electronically and may include, for example, an application-specific IC (ASIC) chip, a field-programmable gate array (FPGA), and a programmable-logic device for performing some operations, which are known or will be developed.

At least a part of an apparatus (e.g., modules or functions thereof) or a method (e.g., operations) according to various embodiments may be, for example, implemented by instructions stored in a computer-readable storage media in the form of a program module. The instruction, when executed by a processor (e.g., the processor of FIG. 1a), may cause the processor to perform a function corresponding to the instruction. The computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), an embedded memory, and the like. The one or more instructions may contain a code made by a compiler or a code executable by an interpreter.

Each component (e.g., a module or a program module) according to various embodiments may be composed of single entity or a plurality of entities, a part of the above-described sub-components may be omitted, or other sub-components may be further included. Alternatively or additionally, after being integrated in one entity, some components (e.g., a module or a program module) may identically or similarly perform the function executed by each corresponding component before integration. According to various embodiments, operations executed by modules, program modules, or other components may be executed by a successive method, a parallel method, a repeated method, or a heuristic method, or at least one part of operations may be executed in different sequences or omitted. Alternatively, other operations may be added.

The invention claimed is:

1. An electronic device comprising:
a main body unit including a grip area for gripping by a user;
a first joint portion formed at or connected to one end of the main body unit;
a first sub-body unit connected to the main body unit by the first joint portion; and
a communication circuit,
wherein the main body unit includes a main PCB including a processor,
the first joint portion includes a first motor PCB including a first control circuit and a first antenna radiator electrically connected to the main PCB,
the processor is configured to allow the first control circuit of the first motor PCB to control the first sub-body unit connected by the first joint portion, and
the communication circuit is configured to transmit and receive signals to and from an external device using the first antenna radiator of the first motor PCB,
wherein the electronic device further comprises:
a second joint portion connected to a portion of the first sub-body unit; and
a second sub-body unit connected to the first sub-body unit by the second joint portion,
wherein the second joint portion includes a second motor PCB including a second control circuit and a second antenna radiator electrically connected to the main PCB,
the processor is configured to allow the second control circuit of the second motor PCB to control the second sub-body unit, and
the communication circuit is configured to be electrically connected to the second antenna radiator and configured to transmit and receive the signals to and from the external device using the second antenna radiator of the second motor PCB.

2. The electronic device of claim 1, wherein the communication circuit is configured to transmit and receive the signals to and from the external device using the first antenna radiator.

3. The electronic device of claim 1, wherein the communication circuit is configured to perform a Bluetooth communication using the first antenna radiator.

4. The electronic device of claim 1, wherein at least a portion of the first joint portion includes a non-conductive material.

5. The electronic device of claim 4, wherein the communication circuit is configured to receive the signals via at least the portion of the first joint portion.

6. The electronic device of claim 1, wherein at least a portion of the second joint portion includes an injection member.

7. The electronic device of claim 6, wherein the communication circuit is configured to perform a WiFi communication, a cellular communication, or an LTE communication using the second antenna radiator.

8. The electronic device of claim 1, further comprising:
a third joint portion connected to a portion of the second sub-body unit; and
a mounting portion connected to the second sub-body unit by the third joint portion,
wherein the third joint portion includes a third control circuit and a third motor PCB electrically connected to the main PCB, and
the processor is configured to allow the third control circuit of the third motor PCB to control the mounting portion.

9. The electronic device of claim 8, wherein the processor is configured to control the first control circuit of the first motor PCB, the second control circuit of the second motor PCB, and the third control circuit of the third motor PCB such that a shaking of an image taken by a camera fixed to the mounting portion is reduced.

10. The electronic device of claim 8, wherein the communication circuit is configured to transmit and receive signals to and from a camera fixed to the mounting portion using the first antenna radiator.

11. The electronic device of claim 10, wherein the communication circuit is configured to transmit a control signal to the camera using the first antenna radiator to control the camera.

12. The electronic device of claim 1, wherein the main body unit or the first joint portion further includes a button portion to control the external device.

13. The electronic device of claim 12, wherein the communication circuit is configured to transmit and receive a control signal for controlling the external device using the first antenna radiator based on an instruction input thereto through the button portion.

14. The electronic device of claim 1, wherein the first antenna radiator is a conductive pattern disposed on the first motor PCB, and the second antenna radiator is a conductive pattern disposed on the second motor PCB.

\* \* \* \* \*